United States Patent
Scheid (10) Patent No.: US 8,907,482 B2
(45) Date of Patent: Dec. 9, 2014

(54) INTEGRATED CIRCUIT PACKAGE INCLUDING WIRE BOND AND ELECTRICALLY CONDUCTIVE ADHESIVE ELECTRICAL CONNECTIONS

(71) Applicant: Honeywell International Inc., Morristown, NJ (US)

(72) Inventor: David Scheid, Eau Claire, WI (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/672,393

(22) Filed: Nov. 8, 2012

(65) Prior Publication Data

US 2014/0124962 A1 May 8, 2014

(51) Int. Cl.
*H01L 23/31* (2006.01)
*H01L 23/532* (2006.01)

(52) U.S. Cl.
USPC ........... 257/746; 257/782; 257/784; 257/748; 257/E23.127; 257/E23.155

(58) Field of Classification Search
USPC .................. 257/782, 784, 748, 746, E23.127, 257/E23.155
See application file for complete search history.

(56) References Cited

U.S. PATENT DOCUMENTS

| | | | |
|---|---|---|---|
| 5,049,434 A | 9/1991 | Wasulko | |
| 5,838,061 A * | 11/1998 | Kim | 257/686 |
| 5,933,712 A | 8/1999 | Bernhardt et al. | |
| 5,965,944 A | 10/1999 | Frankoski et al. | |
| 6,641,860 B1 | 11/2003 | Kaiserman et al. | |
| 6,908,794 B1 | 6/2005 | Chiang | |
| 7,045,884 B2 | 5/2006 | Standing | |
| 7,858,445 B2 | 12/2010 | Honer et al. | |
| 7,972,650 B1 | 7/2011 | Church et al. | |
| 8,143,100 B2 | 3/2012 | Karnezos | |
| 8,153,517 B2 | 4/2012 | Sheats | |
| 8,232,576 B1 | 7/2012 | Lin et al. | |
| 8,395,253 B2 * | 3/2013 | Zhuang | 257/704 |
| 2002/0050407 A1 * | 5/2002 | Sohn et al. | 174/262 |
| 2005/0161786 A1 * | 7/2005 | Zhuang | 257/678 |
| 2006/0057763 A1 | 3/2006 | Teo et al. | |
| 2008/0006841 A1 * | 1/2008 | Okimura | 257/99 |
| 2010/0044088 A1 | 2/2010 | Watanabe et al. | |
| 2011/0315956 A1 | 12/2011 | Tischler et al. | |
| 2013/0163206 A1 * | 6/2013 | Kobayashi et al. | 361/709 |

OTHER PUBLICATIONS

Kisiel et al., "Conductive Adhesives for Through Holes and Blind Vias Metallization," Microelectronics Reliability 45 (Apr. 2005) 1935-1940.

* cited by examiner

*Primary Examiner* — Victor A Mandala
(74) *Attorney, Agent, or Firm* — Shumaker & Sieffert, P.A.

(57) ABSTRACT

A system may include a package defining a cavity and an integrated circuit (IC) disposed within the cavity. The package may include a first electrically conductive package contact and a second electrically conductive package contact. The IC may include a first electrically conductive IC contact and a second electrically conductive IC contact. The system also may include a wire bond extending between and electrically connecting the first electrically conductive package contact and the first electrically conductive IC contact. The system further may include an electrically conductive adhesive extending between and electrically connecting the second electrically conductive package contact and the second electrically conductive IC contact. Use of wire bonds and electrically conductive adhesive may increase an interconnect density between the IC and the package, while not requiring an increase in size of the IC or a decrease in pitch between wire bonds.

19 Claims, 5 Drawing Sheets

INTEGRATED CIRCUIT PACKAGE INCLUDING WIRE BOND AND ELECTRICALLY CONDUCTIVE ADHESIVE ELECTRICAL CONNECTIONS

TECHNICAL FIELD

The disclosure relates to integrated circuit package assemblies.

BACKGROUND

In some applications, an integrated circuit can be enclosed in a package. The package can provide electrical connections between the integrated circuit and a component on which the package is mounted, e.g., a printed board. The package also may protect the integrated circuit, e.g., from the external environment.

SUMMARY

The disclosure describes an integrated circuit package assembly including an integrated circuit (IC) and an integrated circuit package, where the assembly includes both wire bonds and electrically conductive adhesive connections between electrical contacts of the IC enclosed within the package and electrical contacts of the package. By using both wire bonds and electrically conductive adhesive connections, the number of electrical connections at perimeter of the IC may be increased, e.g., compared to using only wire bonds. In this way, more electrical connections may be made between the package and the IC without increasing a perimeter of the IC or decreasing a pitch between wire bonds. Because the number electrical connections between the IC and the package may impact performance or functionality of the IC in some cases, increasing the number of electrical connections may increase performance or functionality of the IC.

In one aspect, the disclosure is directed to an IC package assembly that includes a package defining a cavity. In accordance with this aspect of the disclosure, the package includes a first electrically conductive package contact and a second electrically conductive package contact. The package assembly also may include an IC disposed within the cavity. The IC may define a perimeter including an edge, and may include a first electrically conductive IC contact and a second electrically conductive IC contact. The package assembly further may include a wire bond extending between and electrically connecting the first electrically conductive package contact and the first electrically conductive IC contact and an electrically conductive adhesive extending between and electrically connecting the second electrically conductive package contact and the second electrically conductive IC contact.

In another aspect, the disclosure is directed to an IC package assembly that includes a package defining a cavity and an IC disposed within the cavity. In accordance with this aspect of the disclosure, the package may include a plurality of package signal contacts, a package power contact, and a package ground contact. The IC may define a perimeter including an edge and may include a plurality of IC signal contacts, an IC power contact, and an IC ground contact. The package assembly also may include a plurality of wire bonds extending between and electrically connecting respective ones of the plurality of package signal contacts and respective ones of the plurality of IC signal contacts. Moreover, the package assembly may include a first electrically conductive adhesive trace extending between and electrically connecting the package power contact and the IC power contact and a second electrically conductive adhesive trace extending between and electrically connecting the package ground contact and the IC ground contact.

In an additional aspect, the disclosure is directed to a method that includes forming, using an electrically conductive adhesive, an electrically conductive trace between a first electrically conductive package contact of a package and a first electrically conductive IC contact of an IC disposed in a cavity defined by the package. The method also may include electrically connecting a second electrically conductive package contact of the package and a second electrically conductive IC contact of the IC using a wire bond.

The details of one or more examples are set forth in the accompanying drawings and the description below. Other features, objects, and advantages of the disclosure will be apparent from the description and drawings, and from the claims.

DETAILED DESCRIPTION

The disclosure describes an integrated circuit (IC) package assembly that includes an IC, a package, and both wire bonds and electrically conductive adhesive connections between electrical contacts of the IC disposed within the package and electrical contacts of the package. With ICs that utilize wire bonds, the total number of wire bonds may be limited by a perimeter of the IC and a pitch between the individual wire bonds. In some instances, the number of wire bonds can affect (e.g., limit) performance or functionality of the IC, because the rate at which the IC can retrieve data from or send data to sources outside of the IC (e.g., system memory or the like) may be affected by the number of electrical connections between the IC and package. In some cases, increasing the perimeter of the IC requires increasing the area of the IC. Increasing the area of the IC may increase the cost of the IC. Thus, increasing the number of wire bonds to increase performance of functionality of the IC can increase the cost of the IC in some cases.

In accordance with some aspects of the disclosure, the number of electrical connections at a perimeter of the IC is increased, e.g., compared to using only wire bonds, by using both wire bonds and electrically conductive adhesive connections. In this way, the example IC package assemblies described herein may help increase the number of electrical connections made between the IC and the package without increasing a perimeter of the IC. The electrically conductive adhesive connection may define an electrical connection between an electrical contact of the IC and an electrical contact on the package. In some examples, the IC electrical contact may be in a different plane than the package electrical contact. In other examples, the IC electrical contact may be in the same plane as the package electrical contact.

In some examples, multiple, layered electrical connections may be made using electrically conductive adhesive, with nonconductive adhesive between the layers of electrically conductive adhesive. This may allow a further increase in interconnect density between the IC and the package, e.g., by allowing three or more interconnects within an area of the IC package assembly at which a single wire bond connection could be made.

Figure 1:
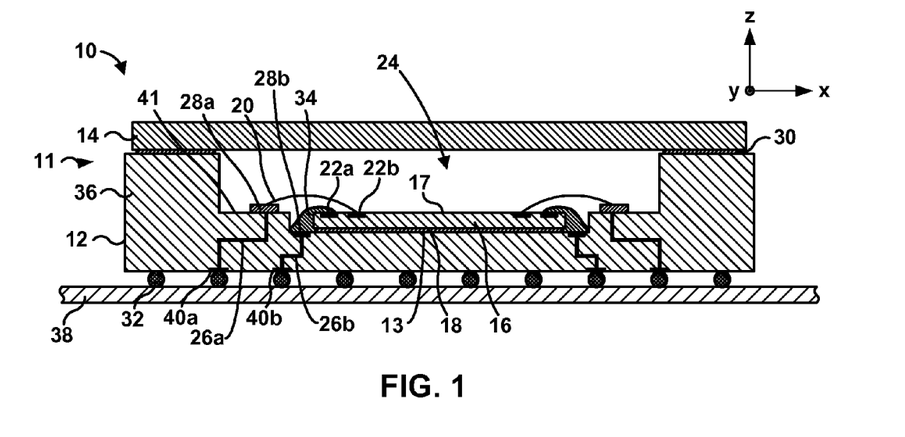
FIG. 1 is a conceptual cross-sectional diagram that illustrates an example IC package assembly that includes wire bonds and electrically conductive adhesive traces.

FIG. 1 is a conceptual cross-sectional diagram that illustrates an example IC package assembly 10 that includes wire bonds and electrically conductive adhesive traces. IC package assembly 10 includes an IC 16 and a package 11 comprising a package base 12 and package lid 14. Package base 12 defines a cavity 24 in which IC 16 is disposed. When assembled, package lid 14 covers cavity 24 to substantially enclose IC 16 within cavity 24. IC 16 may be adhered or otherwise attached to package base 12 by, for example, a layer of adhesive 18, such as an epoxy adhesive. In the example shown in FIG. 1, IC 16 is attached to surface 13 of package base 12.

Package lid 14 and package base 12 may be attached using a sealing material 30. In some examples, the materials from which package lid 14, package base 12, and sealing material 30 are formed may be selected to result in a hermetic IC package assembly 10. In some examples of a hermetic IC package assembly 10, sealing material 30 may include gold-tin (AuSn), gold-germanium (AuGe), tin-lead (SnPb), metal filled glasses, or lead free solder (e.g., tin-silver-copper alloys). In other examples, the materials from which package lid 14, package base 12, and/or sealing material 30 are formed may be selected to form a near-hermetic IC package assembly 10. In some examples of a near-hermetic IC package assembly 10, sealing material 30 may include a polymeric adhesive. In some implementations, the polymeric adhesive may be filled with thermally and/or electrically conductive particles such as silver, gold, AlN, SiC, or diamond.

In some examples, package base 12 may include, for example, an electrically non-conductive ceramic material, such as alumina, aluminum nitride (AlN), silicon carbide (SiC), beryllium oxide (BeO), or the like. These materials may be used to form a hermetic IC package assembly 10 in some examples. In other examples, package base 12 may include another electrically non-conductive material, such as a liquid crystal polymer. While a liquid crystal polymer may not be strictly hermetic, as it may permit slow diffusion of water or other materials into the interior of IC package assembly 10, it may be classified as providing a near-hermetic package for IC 16.

Although FIG. 1 illustrates a package base 12 including sidewalls 36 on which package lid 14 rests, other configurations of a package base and package lid are contemplated. For example, an IC package assembly 10 may include a package base 12 that is substantially planar. The IC package assembly 10 then may include a package lid 14 that comprises walls that extend in a substantially z-axis direction (orthogonal x-y-z axes are shown in the figures for ease of description only) from the lid 14 proximate to an outer perimeter of package lid 14. The walls of the package lid 14 may extend sufficiently far in the z-axis direction to rest on the package base 12 and allow formation of a seal with package base 12 via sealing material 30 and define a space in which IC 16 may be disposed (e.g., substantially fully enclosed, such as fully enclosed or nearly fully enclosed).

Package base 12 also includes a plurality of conductive traces 26a and 26b (collectively, "conductive traces 26") that extend through package base 12 from an interior surface of package base 12 to an exterior surface of package base 12. In some examples, conductive traces 26 may be formed by doping portions of package base 12 with an electrically conductive material. For example, SiC may be doped with Al to increase the electrically conductivity of the SiC. In other examples, conductive traces 26 may include a metal or other conductive material that has been deposited in openings defined in package base 12. For example, the openings may be formed in package base 12 by chemical etching or mechanical removal of material from package base 12, e.g., using a laser. The openings may then be filled with conductive material, such as a copper (Cu), tungsten (W), molybdenum (Mo), a thick film electrically conductive paste, such as a silver-palladium (Ag—Pd) alloy or mixture in an organic binder, or the like, to form conductive traces 26.

In the example shown in FIG. 1, respective ones of conductive traces 26 electrically connect a contact pad (e.g., one of interior package contacts 28a and 28b (collectively, "interior package contacts 28")) on an interior surface of base 12 to a contact pad (e.g., one of exterior package contacts 40a and 40b (collectively, "exterior package contacts 40")) on an exterior surface of package base 12. Interior package contacts 28 and exterior package contacts 40 may be formed of an electrically conductive material, such as an electrically conductive metal or alloy, and may be formed on a surface of package base 12 using, for example, sputtering, physical vapor deposition, screen printing, or the like.

In the example of FIG. 1, first interior package contact 28a is formed on a plateau 41 of package base 12. Plateau 41 may be a portion of package base 12 that is in a different plane (e.g., parallel to the x-y plane of FIG. 1) than the x-y plane in which surface 13 of package base 12 is located (i.e., the surface to which IC 16 is attached). In some examples, package base 12 may define a plurality of plateaus, e.g., to facilitate formation of interior package contacts 28 in different planes parallel to the x-y plane of FIG. 1.

Figure 3:
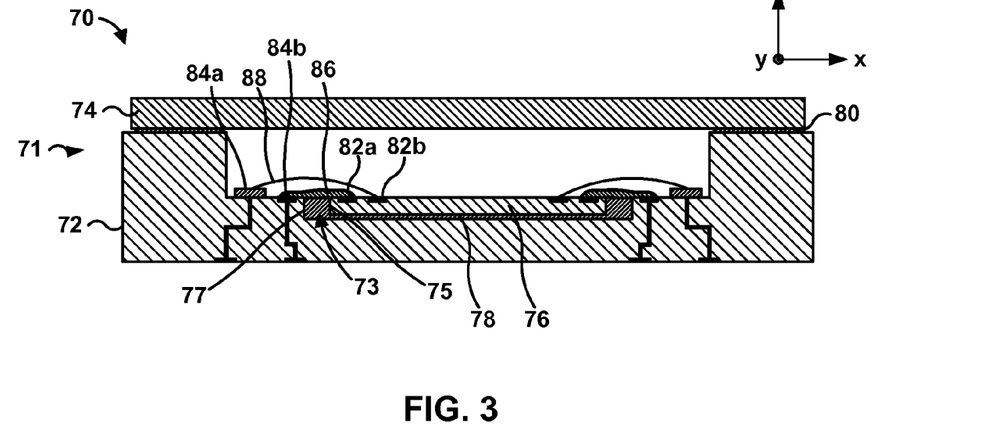
FIG. 3 is a conceptual cross-sectional diagram that illustrates an example IC package assembly that includes wire bonds and electrically conductive adhesive traces.
Figure 5:
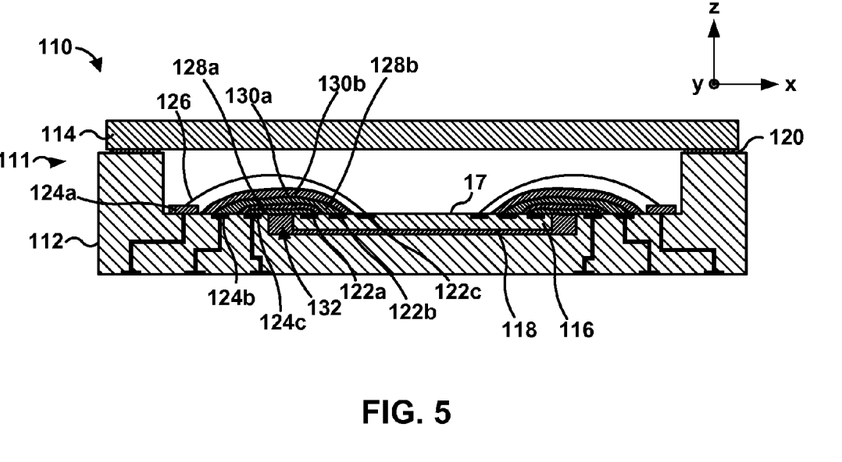
FIG. 5 is a conceptual cross-sectional diagram that illustrates an example IC package assembly that includes wire bonds and multiple layers of electrically conductive adhesive traces.

Second interior package contact 28b is formed on surface 13, i.e., the surface to which IC 16 is attached. In other examples, second interior package contact 28b may be formed in a different plane, or may be formed in the same plane as first interior package contact, e.g., as shown in FIGS. 3 and 5. Having interior package contacts 28 in different planes may facilitate formation of multiple electrical connections between package base 12 and IC 16 in a relatively small distance (e.g., parallel to the y-axis of FIG. 1). Additionally, although FIG. 1 illustrates plateau 41 being substantially parallel to the x-y plane of FIG. 1, in other examples, plateau 41 may not be substantially parallel to the x-y plane.

Exterior package contacts 40 may be electrically connected to an external device, such as printed board 38 using any suitable technique. For example, in the example shown in FIG. 1, exterior package contacts 40 are electrically connected to solder balls 32, which may be used to electrically connect IC package assembly 10 to PB 38. In other examples, an electrical connection between IC package assembly 10 and PB 38 (or another device) may be made through a plurality of pins disposed along the bottom surface of package base 12, a plurality of solder columns disposed along the bottom surface of package base 12, or a plurality of package leads around the perimeter of package base 12. In this way, interior package contacts 28, conductive traces 26, and exterior package contacts 40 facilitate electrical communication between IC 16 disposed within cavity 24 and the exterior of IC package assembly 10.

IC package assembly 10 includes wire bond 20 and electrically conductive adhesive trace 34 electrically connecting respective ones of IC contacts 22a and 22b (collectively, "IC contacts 22") on top surface 17 of IC 16 to respective ones of interior package contacts 28 to provide electrical communication between IC 16 and package base 12, and, ultimately, PB 38. Individual ones of IC contacts 22 may electrically connect to circuitry within IC 16 or a ground plane in IC 16. IC contacts 22 may be formed using any suitable technique, such as by etching or otherwise removing a passivation layer from top surface 17 of IC 16 to expose an underlying conductive layer and define separate IC contacts 22. The passivation layer may include, for example, silicon nitride ($SiN_x$), silicon dioxide ($SiO_2$), polyimide, or another oxide or nitride. In some embodiments, the passivation layer may comprise a porous oxide.

As shown in FIG. 1, wire bond 20 electrically connects first interior package contact 28a and second IC contact 22b. Electrically conductive adhesive trace 34 electrically connects first IC contact 22a and second interior package contact 28b. First IC contact 22a is located closer to an edge (not labeled in FIG. 1) of IC 16 than second IC contact 22b. Similarly, second interior package contact 28b is located closer to IC 16 than first interior package contact 28a. Hence, in the example shown in FIG. 1, electrically conductive adhesive trace 34 electrically connects contacts closer to the edge of IC 16 than the contacts 28a and 22b that wire bond 20 electrically connects.

In some examples, the material from which electrically conductive adhesive trace 34 is formed may be applied to IC package assembly 10 in an uncured state, which may allow the adhesive material to flow. As shown in FIG. 1, this may allow electrically conductive adhesive trace 34 to follow surfaces, such as the edge of IC 16. In some implementations, as illustrated in FIG. 1, this may allow second interior package contact 28b to be located on a different plane (e.g., parallel to the x-y plane of FIG. 1) than the plane (e.g., parallel to the x-y plane of FIG. 1) on which first IC contact 22a is located. This may facilitate wire bond 20 passing above (e.g., in the z-axis direction FIG. 1) electrically conductive adhesive trace 34 by allowing more room for wire bond 20. In this way, in some examples, wire bond 20 and electrically conductive adhesive trace 34 may define electrically conductive pathways between IC 16 and package base 12 that may, but need not, lie in a common plane (e.g., in the x-z plane) and do not intersect with each other in that plane.

Electrically conductive adhesive trace 34 may be formed of an electrically conductive adhesive, such as an electrically conductive epoxy. Electrically conductive epoxies may include an epoxy resin filled with a conductive material, such as silver, gold, or metal-coated class particles. Electrically conductive epoxies may be relatively flexible (e.g., lower modulus), which may reduce effects of thermal expansion coefficients between the epoxy and IC 16 and/or between the epoxy and package base 12. In some examples, the electrically conductive material from which adhesive trace 34 is formed may be more flexible than both IC 16 and package base 12. Additionally, electrically conductive epoxies may cure at temperatures that are sufficiently low to not damage other components of IC package, such as IC 16, wire bond 20, package base 12, package lid 14, or the like.

The adhesive from which electrically conductive adhesive trace 34 is formed may be deposited using any suitable technique, such as, but not limited to, screen printing, jet printing, or dispensing.

Although only a single electrically conductive adhesive trace 34 is labeled in FIG. 1, in many examples, IC package assembly 10 may include a plurality of electrically conductive adhesive traces 34. In some examples, at least one trace 34 of the plurality of electrically conductive adhesive traces 34 may electrically connect second package contacts 28b that are at ground potential to first IC contacts 22a also at ground potential. This may allow (e.g., by freeing-up) wire bonds 20 to be used to connect first package contacts 28a and second IC contacts 22b that are at a power potential and/or first package contacts 28a and second IC contacts 22b that are used for signal input to and output from IC 16.

Wire bond 20 may be any suitable wire bond, such as, but not limited to, a gold, copper, aluminum, or alloy wire, and may be attached to first electrically conductive package contact 28a and second electrically conductive IC contact 22b using any suitable technique, such as, but not limited to, heat welding, ultrasonic welding, soldering, ball bonding, wedge bonding, or the like.

In other examples, at least one trace 24 of the plurality of electrically conductive adhesive traces 34 may electrically connect second package contacts 28b that are at a power potential to first IC contacts 22a also at the power potential. This may allow wire bonds 20 to be used to connect first package contacts 28a and second IC contacts 22b that are at ground potential and/or first package contacts 28a and second IC contacts 22b that are used for signal input to and output from IC 16.

In other examples, some traces 34 of the plurality of electrically conductive adhesive traces 34 may electrically connect second package contacts 28b that are at a power potential to first IC contacts 22a also at the power potential and other traces 34 of the plurality of electrically conductive adhesive traces 34 may electrically connect second package contacts 28b that are at ground potential to first IC contacts 22a also at ground potential. This may allow wire bonds 20 to be used to connect first package contacts 28a and second IC contacts 22b that are used for signal input to and output from IC 16.

In other examples, some traces 34 of the plurality of electrically conductive adhesive traces 34 may electrically connect second package contacts 28b that are used for signal input to and output from IC 16. In some examples, other traces 34 of the plurality of electrically conductive adhesive traces 34 may electrically connect second package contacts 28b that are at ground or power potential. In any of these examples, the net result is that more electrical connections are available between IC 16 and package 12 than if IC package assembly 10 only included wire bonds. In this way, use of both wire bonds 20 and electrically conductive adhesive traces 34 may increase an interconnect density between IC 16 and package base 12 compared to using only wire bonds 20, while not requiring an increase in size of IC 16 or a decrease in pitch between wire bonds 20 to accommodate the increase in interconnect density.

Figure 2:
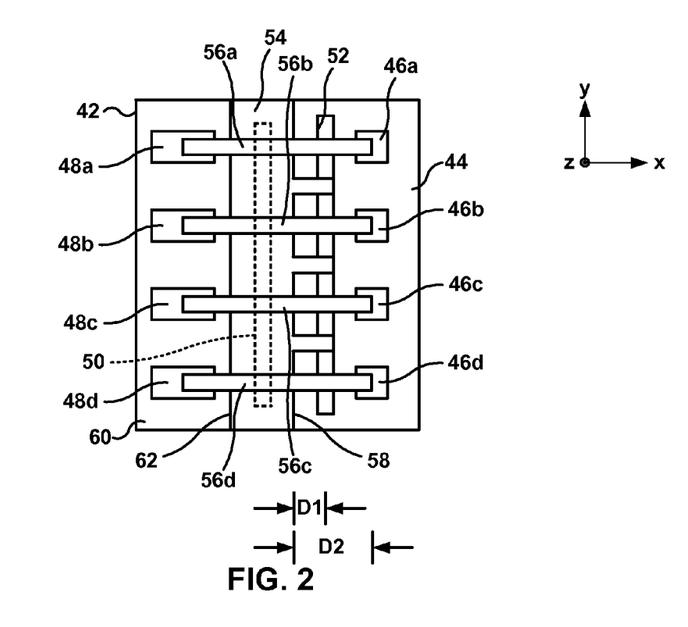
FIG. 2 is a conceptual diagram that illustrates a plan view of a portion of an example package base and an example IC.

FIG. 2 is a conceptual diagram that illustrates a plan view of a portion of an example package base 42 and IC 44. The plan view of FIG. 2 may be an example of a portion of IC package assembly 10 illustrated in FIG. 1. As shown in FIG. 2, IC 44 (which may be an example of IC 16 of FIG. 1) defines an IC edge 58 at a perimeter of IC 44. IC 44 includes an IC power or ground contact 52 and a plurality of IC signal contacts 46a, 46b, 46c, and 46d (collectively, "IC signal contacts 46").

A center of IC power or ground contact 52 is a first distance D1 (measured in the x-axis direction in the example shown in FIG. 2) from IC edge 58. A center of each of IC signal contacts 46 is a second distance D2 (measured in the x-axis direction) from IC edge 58. Hence, when measured relative to and at a same location along IC edge 58 (e.g., along the y-axis of FIG. 2, where orthogonal x-y-z axes are shown for purposes of illustration only), IC power or ground contact 52 is a distance D1 from edge 58, while an IC signal contact 46 is a distance D2 from edge 58, and D2 is greater than D1. Although the distances for each of IC signal contacts 46 are substantially the same in FIG. 2, in other implementations, they may be different.

FIG. 2 also illustrates a package edge 62 of a plateau 60 of package base 42 (which may be an example of package base 12 of FIG. 1). When IC 44 is disposed within a cavity defined by package base 42, package base 42 and IC 44 define a channel between IC edge 58 and package edge 62. The channel is at least partially filled with conductive adhesive trace 54. In some examples, the channel may be substantially filled with conductive adhesive trace 54 (e.g., filled to be substantially the same height as the surface of plateau 60 or a top surface of IC 44). Package base 42 includes a plurality of package signal contacts 48a, 48b, 48c, and 48d (collectively, "package signal contacts 48") and a package power or ground contact 50. In the example shown in FIG. 2, package power or ground contact 50 is disposed on a surface of package base 42 at a bottom of the channel. Package signal contacts 48 are disposed on a surface of plateau 60. Hence, package power or ground contact 50 is located on a different plane (e.g., a plane parallel to the x-y plane shown in FIG. 2) than the plane in which package signal contacts 48 are located. In some examples, IC power or ground contact 52 corresponds to first IC contact 22a shown in FIG. 1 and package power or ground contact 50 corresponds to second package contact 28b. Similarly, IC signal contacts 46 may correspond to second IC contact 22b and package signal contacts 48 may correspond to first package contact 28a.

As shown in FIG. 2, respective ones of package signal contacts 48 are electrically connected to respective ones of IC signal contacts 46 using respective ones of wire bonds 56a, 56b, 56c, and 56d (collectively, "wire bonds 56"). IC power or ground contact 52 is electrically connected to package power or ground contact 50 using electrically conductive adhesive trace 54. FIG. 2 more clearly illustrates that wire bonds 56 are located above electrically conductive adhesive trace 54 (e.g., in the z-axis direction of FIG. 2). In other words, wire bonds 56 are located in a different plane (e.g., a plane parallel to the x-y plane shown in FIG. 2) than electrically conductive adhesive trace 54 for substantially all the distance in which wire bonds 56 and electrically conductive adhesive trace 54 overlap (e.g., in the x-axis direction of FIG. 2). Thus, in a space that one wire bond 56 occupies, the IC package assembly shown in FIG. 2 may include at least one additional and separate electrical connection between IC 44 and package 42 (provided by trace 54). In this way, FIG. 2 illustrates how use of both wire bonds 56 and electrically conductive adhesive trace 54 may increase an interconnect density between IC 44 and package base 42 compared to using only wire bonds 56, while not requiring an increase in size of IC 16 or a decrease in pitch (e.g., distance between) between wire bonds 56.

In some examples, instead of an electrically conductive adhesive trace being used to electrically connect an IC contact to a package contact located in a different plane, the electrically conductive adhesive trace may be used to electrically connect an IC contact to a package contact located along substantially the same plane. One example configuration that may facilitate this is shown in FIG. 3. FIG. 3 is another conceptual cross-sectional diagram that illustrates another example IC package assembly 70 that includes wire bonds and electrically conductive adhesive traces. In some examples, IC package assembly 70 may be generally similar to IC package assembly 10 of FIG. 1, aside from the differences described herein. Some reference numerals have been omitted from FIG. 3 (compared to FIG. 1) for ease of description only.

IC package assembly 70 includes package 71 that comprises a package base 72 and package lid 74, which may be similar to package base 12 and package lid 14 of FIG. 1, respectively. Similarly, IC 76, adhesive 78, first IC contact 82a, second IC contact 82b, first package contact 84a, and wire bond 88 may be similar to IC 16, adhesive 18, first IC contact 22a, second IC contact 22b, first package contact 28a, and wire bond 20 described with reference to FIG. 1.

In contrast to IC package assembly 10 of FIG. 1, second package contact 84b is located in the substantially the same x-y plane (where orthogonal x-y-z axes are shown in FIG. 3 for ease of description only) as first package contact 84a. Second package contact 84b is also located in substantially the same x-y plane as first IC contact 82a and second IC contact 82b.

Also different from IC package assembly 10, IC package assembly 70 includes nonconductive adhesive 78 disposed in channel 73 between an IC perimeter 75 of IC 16 and a package edge 77 of package base 72. Nonconductive adhesive 78 at least partially fills channel 73. In the example shown in FIG. 3, nonconductive adhesive 78 substantially fully (e.g., fully or nearly fully) fills channel 73. In some examples, nonconductive adhesive 78 may include an electrically nonconductive epoxy or other electrically nonconductive adhesive.

Electrically conductive adhesive trace 86 is disposed on nonconductive adhesive 78 over channel 73 and extends from second package contact 84b to first IC contact 82a. In this way, electrically conductive adhesive trace 86 electrically connects second package contact 84b and first IC contact 82a. By filling channel 73 with nonconductive adhesive 78, less electrically conductive adhesive may be used to form electrically conductive adhesive trace 86, particularly when second package contact 84b is formed on substantially the same plane as first IC contact 82a. In some examples, the use of nonconductive adhesive 78 to at least partially fill channel 73 also may reduce a possibility that an electrical short between adjacent electrically conductive materials may inadvertently be formed.

Although only a single electrically conductive adhesive trace 86 is labeled in FIG. 3, in some examples, IC package assembly 70 may include a plurality of electrically conductive adhesive traces 86. As described above with respect to FIG. 1, the plurality of electrically conductive adhesive traces 86 may electrically connect second package contacts 84b that are at ground potential to first IC contacts 82a also at ground potential, power potential, and/or used for signal input to and output from IC 76. In any of these examples, the net result is that more electrical connections are available between IC 76 and package base 72 than if IC package assembly 70 only included wire bonds. In this way, use of both wire bonds 88 and electrically conductive adhesive traces 86 may increase an interconnect density between IC 76 and package base 72 compared to using only wire bonds 88, while not requiring an increase in size of IC 76 or a decrease in pitch between wire bonds 88 to accommodate the increase in interconnect density.

Figure 4:
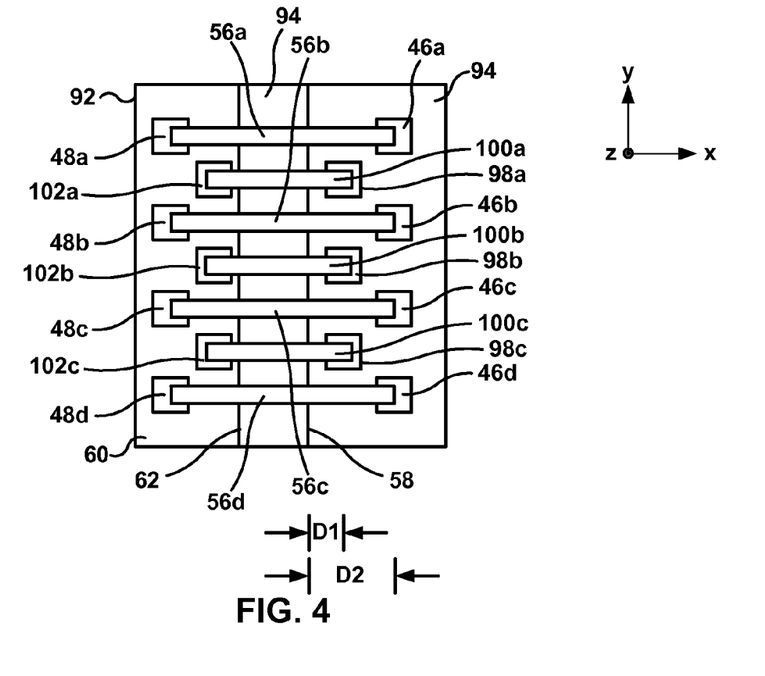
FIG. 4 is a conceptual diagram that illustrates a plan view of a portion of an example package base and an example IC.

FIG. 4 is a conceptual diagram that illustrates a plan view of a portion of an example package base 92 and IC 94. The plan view of FIG. 4 may be an example of a portion of IC package assembly 70 illustrated in FIG. 3. As shown in FIG. 4, IC 94 defines an IC edge 58 at a perimeter of IC 94. IC 94 includes a plurality of IC power or ground contacts 98a, 98b, 98c (collectively, "IC power or ground contacts 98") and a plurality of IC signal contacts 46.

IC power or ground contacts 98 are each a first distance D1 measured in the x-axis direction in the example shown in FIG. 4) from IC edge 58. Each of IC signal contacts 46 is a second distance D2 (measured in the x-axis direction in the example shown in FIG. 4) from IC edge 58. Hence, when measured perpendicular to IC edge 58, each of IC power or ground contacts 98 is a distance D1 from edge 58, which is less than the distance D2 for each of IC signal contacts 46. Although the distances for each of IC power or ground contacts 98 are substantially the same in FIG. 4, in other examples, they may be different. Similarly, the distances for each of IC signal contacts 46 may be different.

FIG. 4 also illustrates a package edge 62 of a plateau 60 of package base 42. When IC 44 is positioned in a cavity defined by package base 42, package base 42 and IC 44 define a channel between IC edge 58 and package edge 62. The channel is at least partially filled with nonconductive adhesive 94. Package base 42 includes a plurality of package signal contacts 48 and a plurality of package power or ground contacts 102a, 102b, 102c (collectively, "package power or ground contacts 102"). Package power or ground contacts 102 and package signal contacts 48 are disposed on a surface of plateau 60. In some implementations, IC power or ground contacts 98 each corresponds to one of first IC contacts 82a and package power or ground contacts 102 each correspond to one of second package contact 84b shown in FIG. 3. Similarly, each of IC signal contacts 46 may correspond to one of second IC contacts 82b and each of package signal contacts 48 may correspond to one of first package contacts 84a.

As shown in FIG. 4, respective ones of package signal contacts 48 are electrically connected to respective ones of IC signal contacts 46 using respective ones of wire bonds 56. Similarly, respective ones of IC power or ground contacts 98 are electrically connected to respective ones of package power or ground contacts 102 using respective ones of electrically conductive adhesive traces 100a, 100b, 100c (collectively, "electrically conductive adhesive traces 100"). Electrically conductive adhesive traces 100 may be examples of electrically conductive adhesive trace 86 of FIG. 3.

Because IC power or ground contacts 98 are offset from IC signal contacts 46 in the y-axis direction of FIG. 4 (where orthogonal x-y-z axes are shown for ease of description only) and package power or ground contacts 102 are also offset from package signal contacts 48 in the y-axis direction (e.g., laterally offset in the y-axis direction), electrically conductive adhesive traces 100 are offset from wire bonds 56 in the y-axis direction. This may decrease a possibility that a wire bond 56 may contact one or more electrically conductive adhesive traces 100, and, therefore, decrease the possibility that an electrical short will inadvertently form between one of wire bonds 56 and one of electrically conductive adhesive traces 100, while still allowing an increase in interconnect density between package base 92 and IC 94 compared to using only wire bonds 56. In some examples, one or more wire bonds 56 may have a respective electrically insulative covering, which may further help electrically isolate wire bonds 56 from each other and from electrically conductive adhesive traces 100.

In some examples, other configurations of electrically conductive adhesive and wire bonds may be used to further increase interconnect density for a similar perimeter of an IC. FIG. 5 is a conceptual cross-sectional diagram that illustrates another example IC package assembly 110, which includes wire bonds and multiple layers of electrically conductive adhesive traces, in accordance with some aspects of the disclosure. In some examples, IC package assembly 110 may be generally similar to IC package 10 of FIG. 1, aside from the differences described herein. Some reference numerals have been omitted from FIG. 5 (compared to FIG. 1) for ease of description only.

IC package assembly 110 includes a package 111 that comprises a package base 112 and package lid 114, which may be similar to package base 12 and package lid 14 of FIG. 1, respectively. Similarly, IC 116, adhesive 118, first IC contact 122a, second IC contact 122b, first package contact 124a, and wire bond 126 may be similar to IC 16, adhesive 18, first IC contact 22a, second IC contact 22b, first package contact 28a, and wire bond 20, respectively, described with reference to FIG. 1.

In contrast to IC package 10 of FIG. 1, second package contact 124b is located in the substantially the same x-y plane (where orthogonal x-y-z axes are shown in FIG. 5 for ease of description only) as first package contact 124a. Second package contact 124b is also located in substantially the same x-y plane as first IC contact 122a and second IC contact 122b. Additionally, package base 112 includes a third package contact 124c. In the example illustrated in FIG. 5, third package contact 124c is located in the substantially the same x-y plane as first package contact 124a and second package contact 124b. IC 116 also includes a third IC contact 122c.

Similar to IC package assembly 70 of FIG. 3, IC package 10 includes nonconductive adhesive 118 disposed in channel 132 defined between a perimeter of IC 116 and an edge of package base 112. Nonconductive adhesive 118 at least partially fills channel 132. In the example shown in FIG. 5, nonconductive adhesive 118 substantially fully fills channel 132. In some examples, nonconductive adhesive 118 may include an electrically nonconductive epoxy or other electrically nonconductive adhesive.

Although nonconductive adhesive 118 is depicted as also being disposed between a bottom surface of IC 116 and a surface of package base 112 to attach IC 116 to the surface of package base 112, in other examples, nonconductive adhesive 118 may not be disposed in this area, and nonconductive adhesive in channel 132 may be used to attach IC 116 to package base 112. In other examples, a different adhesive may be used to attach the bottom surface of IC 116 to package base 112.

First electrically conductive adhesive trace 128a is disposed on nonconductive adhesive 118 over channel 132 and extends from third package contact 124c to first IC contact 122a. In this way, first electrically conductive adhesive trace 128a electrically connects third package contact 124c and first IC contact 122a.

A first layer of nonconductive adhesive 130a is disposed over first electrically conductive adhesive trace 128a. Nonconductive adhesive 130a may be formed from any suitable electrically nonconductive material. In some examples, first layer of nonconductive adhesive 130a may be formed from an electrically insulating epoxy or other electrically insulating adhesive.

A second electrically conductive adhesive trace 128b is disposed on first layer of nonconductive adhesive 130a and extends from second package contact 124b to second IC contact 122b. In this way, second electrically conductive adhesive trace 128b electrically connects second package contact 124b and second IC contact 122b. First layer of nonconductive adhesive 130a electrically and mechanically separates first electrically conductive adhesive trace 128a and second electrically conductive adhesive trace 128b and may reduce a chance of electrical shorting between first electrically conductive adhesive trace 128a and second electrically conductive adhesive trace 128b.

A second layer of nonconductive adhesive 130b is disposed over second electrically conductive adhesive trace 128b. Nonconductive adhesive 130b may be formed from any suitable electrically nonconductive material, such as the ones described above with respect to nonconductive adhesive 130a. Second layer of nonconductive adhesive 130b is configured and positioned to reduce a chance of electrical shorting between second electrically conductive adhesive trace 128b and wire bond 126 disposed over second layer of nonconductive adhesive 130b.

As described above with respect to FIG. 1, the plurality of electrically conductive adhesive traces 128 may electrically connect package contacts 124 that are at ground potential, power potential, and/or used for signal input to and output from IC 116 to IC contacts 122 also at ground potential, power potential, and/or used for signal input to and output from IC 16. In any of these implementations, the net result is that more electrical connections are available between IC 116 and package base 112 than if IC package assembly 110 only included wire bonds. In this way, use of both wire bonds 126 and electrically conductive adhesive traces 128 may increase an interconnect density between IC 116 and package base 112 compared to using only wire bonds 126, while not requiring an increase in size of IC 116 or a decrease in pitch (spacing) between wire bonds 126 to accommodate the increase in interconnect density.

Figure 6:
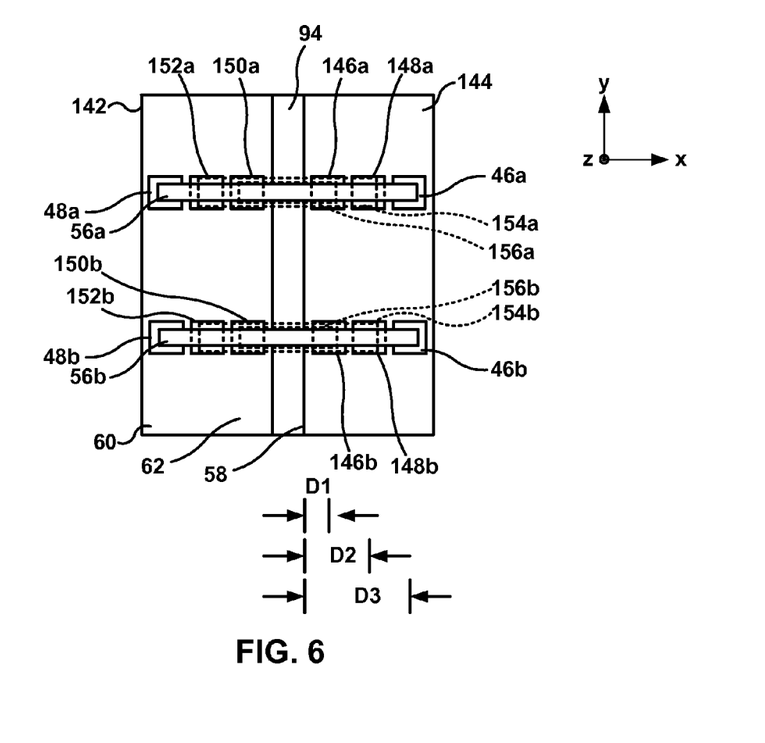
FIG. 6 is a conceptual diagram that illustrates a plan view of a portion of an example package base and an example IC.

FIG. 6 is a conceptual diagram that illustrates a plan view of a portion of an example package base 142 and IC 144, in accordance with some aspects of the disclosure. The plan view of FIG. 6 may be an example of a portion of IC package assembly 110 illustrated in FIG. 5. As shown in FIG. 6, IC 144 defines an IC edge 58 at a perimeter of IC 144. IC 144 includes a plurality of IC power contacts 146a and 146b (collectively, "IC power contacts 146"), a plurality of IC ground contacts 148a and 148b (collectively, "IC ground contacts 148"), and a plurality of IC signal contacts 46. As shown in FIG. 6, each of IC power contacts 146 is a first distance D1 (measured in the x-axis direction in the example shown in FIG. 6) from IC edge 58, each of IC ground contacts 148 is a second distance D2 (measured in the x-axis direction in the example shown in FIG. 6) from IC edge 58, and each of IC signal contacts 46 is a third distance D3 from IC edge 58. In the example of FIG. 3, third distance D3 is greater than second distance D2, and second distance D2 is greater than first distance D1. Although the distances for each of IC power contacts 146 are substantially the same in FIG. 6, in other implementations they may be different. Similarly, the distances for each of IC ground contacts 148 may be different, and the distances for each of IC signal contacts 46 may be different.

FIG. 6 also illustrates a package edge 62 of a plateau 60 of package base 142. When IC 144 is positioned within package base 142, package base 142 and IC 144 define a channel between IC edge 58 and package edge 62. The channel is at least partially filled with nonconductive adhesive 94. Package base 142 includes a plurality of package signal contacts 48 and a plurality of package power contacts 150a and 150b (collectively, "package power contacts 150"). Package base 142 also includes a plurality of package ground contacts 152a and 152b (collectively, "package power contacts 152"). Package power contacts 150, package ground contacts 152, and package signal contacts 48 are disposed on a surface of plateau 60. In some examples, IC power contacts 146 each corresponds to one of first IC contacts 122a and package power contacts 150 each correspond to one of third package contacts 124c shown in FIG. 5. Similarly, each of IC ground contacts 148 may correspond to one of second IC contacts 122b and each of package ground contacts 152 may correspond to one of second package contacts 124b. Additionally, each of IC signal contacts 46 may correspond to one of third IC contacts 122c and each of package IC contacts 48 may correspond to one of first package contacts 124a.

As shown in FIG. 6, respective ones of package signal contacts 48a, 48b are electrically connected to respective ones of IC signal contacts 46a, 46b using respective ones of wire bonds 56a, 56b. Similarly, respective ones of IC power contacts 146a, 146b are electrically connected to respective ones of package power contacts 150a, 150b using respective ones of lower electrically conductive adhesive traces 156a, 156b (collectively, "lower electrically conductive adhesive traces 156"). Respective ones of IC ground contacts 148a, 148b are electrically connected to respective ones of package ground contacts 152a, 152b using respective ones of upper electrically conductive adhesive traces 154a, 154b (collectively, "upper electrically conductive adhesive traces 154").

FIG. 6 illustrates that respective ones of upper electrically conductive adhesive traces 154 are disposed above (e.g., in the z-axis) and share a position (e.g., in the x-y plane) respective ones of lower electrically conductive adhesive traces 156 (where orthogonal x-y-z axes are shown in FIG. 6 for ease of description only). Similar to the example shown in FIG. 5, an electrically insulative adhesive layer may be disposed between respective ones of upper electrically conductive adhesive traces 154 and respective ones of lower electrically conductive adhesive traces 156, e.g., to reduce a chance of electrical shorting between upper electrically conductive adhesive traces 154 and lower electrically conductive adhesive traces 156.

Similarly, respective ones of wire bonds 56 are disposed above respective ones of upper electrically conductive adhesive traces 154. Similar to the example shown in FIG. 5, an electrically insulative adhesive layer may be disposed between respective ones of upper electrically conductive adhesive traces 154 and respective ones of wire bonds 56, e.g., to reduce a chance of electrical shorting between upper electrically conductive adhesive traces 154 and wire bonds 56.

Figure 7:
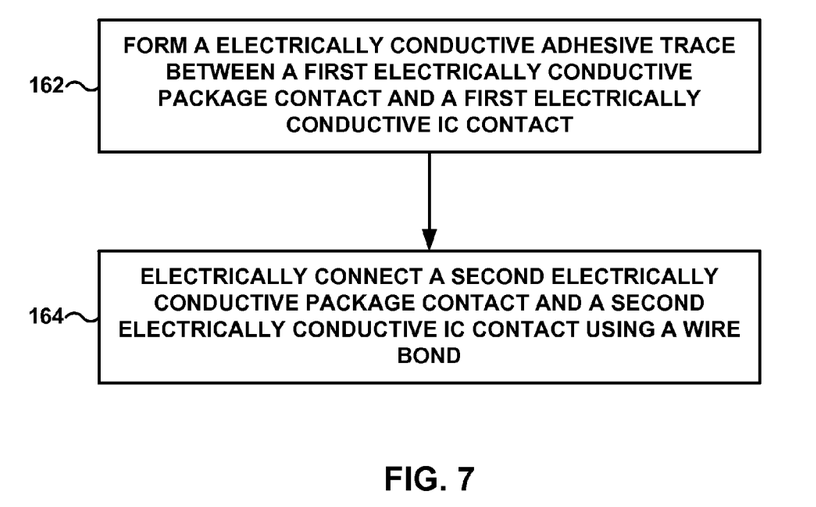
FIG. 7 is a flow diagram that illustrates an example technique for forming an IC package assembly that includes wire bonds and electrically conductive adhesive traces.

FIG. 7 is a flow diagram that illustrates an example technique for forming an IC package that includes wire bonds and electrically conductive adhesive traces. The process of FIG. 7 will be described with concurrent reference to IC package 10 of FIG. 1 for ease of description. In other examples, the process of FIG. 7 may be used to form other IC packages, such as IC package assembly 70 of FIG. 3 or IC package assembly 110 of FIG. 5.

The technique of FIG. 7 includes forming an electrically conductive adhesive trace 34 between a second electrically conductive package contact 28b and a first electrically conductive IC contact 22a (162). The electrically conductive adhesive may be dispensed in any suitable manner, such as, for example, screen printing, jet printing, or dispensing. In some examples, depending on the electrically conductive adhesive used, forming the electrically conductive adhesive trace 34 also may include curing the electrically conductive adhesive. For example, an electrically conductive adhesive may be thermally cured to cause the components of the electrically conductive adhesive to react and form the cured electrically conductive adhesive trace 34. In other examples, curing the adhesive may utilize, for example, ultraviolet (UV) radiation, chemical additives, or the like.

Once electrically conductive adhesive trace 34 has been formed (162), a first electrically conductive package contact 28a and a second electrically conductive IC contact 22b may be electrically connected using a wire bond 20 (164). Wire bond 20 may be any suitable wire bond, such as, but not limited to, a gold, copper, aluminum, or alloy wire, and may be attached to first electrically conductive package contact 28a and second electrically conductive IC contact 22b using any suitable technique, such as, but not limited to, heat welding, ultrasonic welding, soldering, ball bonding, wedge bonding, or the like.

This process may be repeated for each of the plurality of electrically conductive adhesive traces 34 and wire bonds 20 between package base 12 and IC 16. In some examples of the technique shown in FIG. 7, a plurality of electrically conductive adhesive traces 34 may be formed in parallel, e.g., by depositing the electrically conductive adhesive at locations for each of the plurality of electrically conductive adhesive traces 34, then, optionally, curing the plurality of electrically conductive adhesive traces 34 substantially simultaneously. Similar parallelization of forming a plurality of wire bonds 20 may also be performed.

Figure 8:
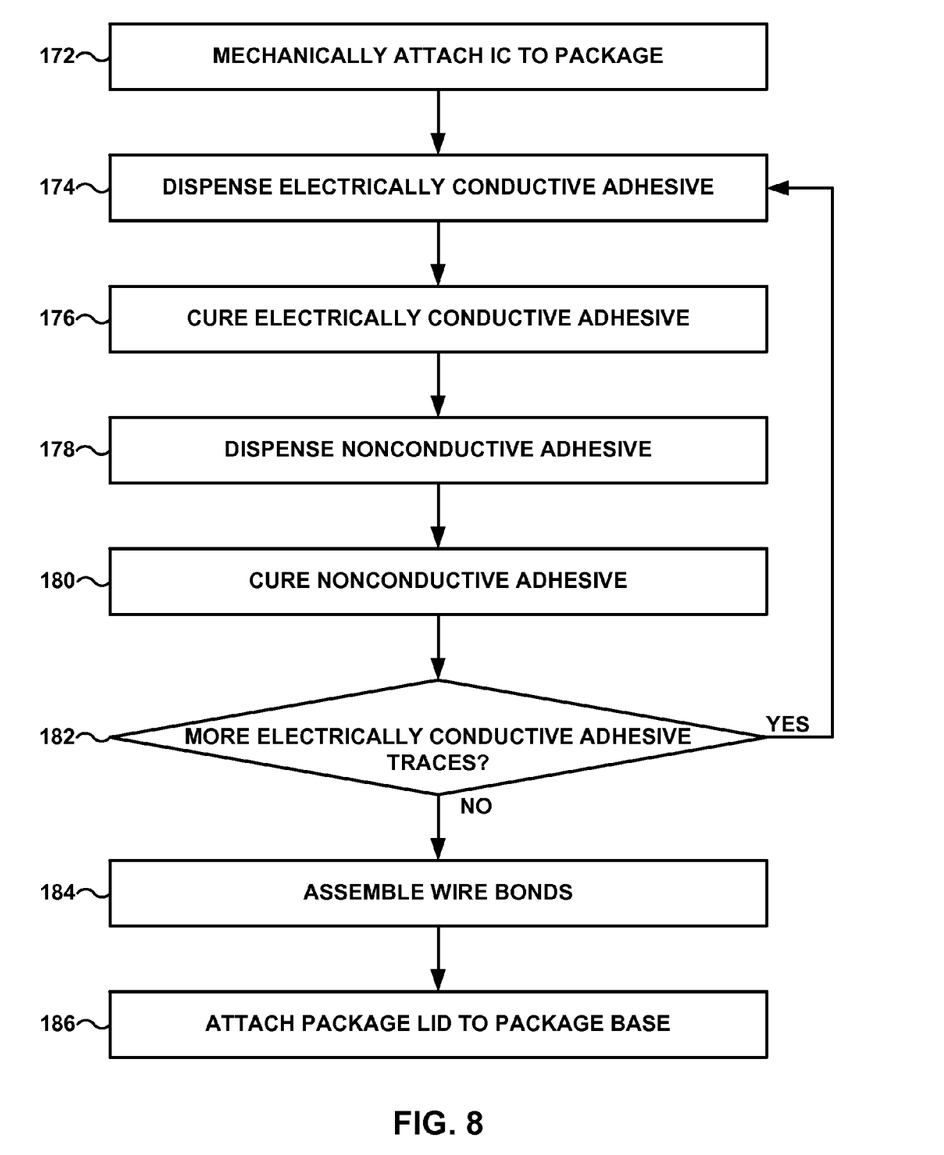
FIG. 8 is a flow diagram that illustrates another example technique for forming an IC package that includes wire bonds and electrically conductive adhesive traces.

FIG. 8 is a flow diagram that illustrates another example technique for forming an IC package that includes wire bonds and electrically conductive adhesive traces. The process of FIG. 8 will be described with concurrent reference to IC package assembly 110 of FIG. 5 for ease of description. In other examples, the process of FIG. 8 may be used to form other IC packages.

The process of FIG. 8 may include mechanically attaching IC 116 to package base 112 (172). In some examples, IC 116 may be mechanically attached to package base 112 using adhesive 118, such as an electrically insulating epoxy adhesive or another electrically insulating adhesive. In some examples, as shown in FIG. 5, adhesive 118 may at least partially fill channel 132 between IC 116 and package base 112. For example, adhesive 118 may substantially fill channel 132 between IC 116 and package base 112. In other examples, adhesive 118 may not fill channel 132. Regardless, adhesive 118 may be disposed in the desired location of package base 112, IC 116 may be placed in contact with adhesive 118, and adhesive 118 may be cured, e.g., using time, temperature, a chemical additive, UV radiation, or the like. Alternatively, adhesive 118 may be disposed in the desired location of IC 116, IC 116 and adhesive 118 may be placed in contact with package base 112, and adhesive 118 may be cured.

Once IC 116 has been mechanically attached to package base 112 (172), electrically conductive adhesive may be dispensed at predetermined locations to connect respective electrical contacts on package base 112 and IC 116 (174). For example, the electrically conductive adhesive that form first electrically conductive adhesive trace 128a may be dispensed to electrically connect third package contact 124c and first IC contact 122a, as shown in FIG. 5. The electrically conductive adhesive then may be cured to form first electrically conductive adhesive trace 128a (176). As described above, in some examples, the electrically conductive adhesive need not be cured.

After first electrically conductive adhesive trace 128a is formed (174 and 176), a first layer of nonconductive adhesive 130a may be dispensed on first electrically conductive adhesive trace 128a (178). First layer of nonconductive adhesive 130a then may be cured, e.g., using time, temperature, a chemical additive, UV radiation, or the like (180). In some instances, first layer of nonconductive adhesive 130a need not be cured.

When additional electrically conductive adhesive traces are required (the "YES" branch of decision block 182), another layer of electrically conductive adhesive may be dispensed on the cured nonconductive adhesive (174). For example, as shown in FIG. 5, electrically conductive adhesive used to form a second electrically conductive adhesive trace 128b may be dispensed on first layer of nonconductive adhesive 130a. Depending on the adhesive used, the electrically conductive adhesive then may be cured (176) to form second electrically conductive adhesive trace 128b.

In some examples, the technique then can include dispensing a layer of nonconductive adhesive on second electrically conductive adhesive trace 128b (178) and curing the layer of nonconductive adhesive (180) to form second layer of nonconductive adhesive 130b. In some examples, where second electrically conductive adhesive trace 128b is a final layer of electrically conductive adhesive, the technique may not include dispensing a layer of nonconductive adhesive on second electrically conductive adhesive trace 128b (178) and curing the layer of nonconductive adhesive (180) to form second layer of nonconductive adhesive 130b.

When no additional electrically conductive adhesive traces are required (the "NO" branch of decision block 182), the technique continues with assembling wire bonds 126. Wire bonds 126 may be formed from any suitable material, such as, but not limited to, utilize a gold, copper, aluminum, or alloy wire, and may be attached to first electrically conductive package contact 124a and third electrically conductive IC contact 122c using, for example, heat welding, ultrasonic welding, soldering, ball bonding, wedge bonding, or the like.

The techniques described with reference to FIGS. 7 and 8 may allow an increase in interconnect density between IC 16 or 116 and package base 12 or 112 compared to using only wire bonds 20 or 126, while not requiring an increase in size of IC 16 or 116 or a decrease in pitch (spacing) between wire bonds 20 or 126.

Various examples have been described. These and other examples are within the scope of the following claims.

What is claimed is:
1. An integrated circuit (IC) package assembly comprising:
a package comprising a ledge and defining a cavity, wherein the package comprises a first electrically conductive package contact and a second electrically conductive package contact located on the ledge;
an IC disposed within the cavity, wherein the IC defines a perimeter including an edge, wherein the IC and the package define a channel between the edge of the IC and the ledge, and wherein the IC comprises a first electrically conductive IC contact and a second electrically conductive IC contact;
a wire bond extending between and electrically connecting the first electrically conductive package contact and the first electrically conductive IC contact; and
an electrically conductive adhesive extending between and electrically connecting the second electrically conductive package contact and the second electrically conductive IC contact, wherein the electrically conductive adhesive at least partially fills the channel.
2. The IC package assembly of claim 1, wherein the first electrically conductive IC contact is a first distance from the edge and the second electrically conductive IC contact is a second distance from the edge, wherein the first and second distances are measured in a direction perpendicular to the edge at a same location of the edge, and wherein the first distance is greater than the second distance.

3. The IC package assembly of claim 1, wherein the channel is at least partially filled with a nonconductive adhesive, and wherein the electrically conductive adhesive is disposed on the nonconductive adhesive.

4. The IC package assembly of claim 3, wherein the nonconductive adhesive comprises a first nonconductive adhesive, further comprising a second nonconductive adhesive disposed between the electrically conductive adhesive and the wire bond.

5. The IC package assembly of claim 1, further comprising a nonconductive adhesive disposed between the wire bond and the electrically conductive adhesive.

6. The IC package assembly of claim 1, wherein the electrically conductive adhesive comprises a first electrically conductive adhesive, wherein the IC further comprises a third electrically conductive IC contact, and wherein the package further comprises a third electrically conductive package contact, the system further comprising:
 a second electrically conductive adhesive extending between and electrically connecting the third electrically conductive IC contact and the third electrically conductive package contact; and
 a nonconductive adhesive disposed between the first electrically conductive adhesive and the second electrically conductive adhesive.

7. The IC package assembly of claim 6, wherein the first electrically conductive IC contact is a first distance from the edge, the second electrically conductive IC contact is a second distance from the edge, and the third electrically conductive IC contact is a third distance from the edge, wherein the first distance, second distance, and third distance are measured in a direction perpendicular to the edge at a same location of the edge, and wherein the first distance is greater than the second distance and the second distance is greater than the third distance.

8. The IC package assembly of claim 6, wherein the nonconductive adhesive is disposed over the second electrically conductive adhesive and the first electrically conductive adhesive is disposed over the nonconductive adhesive.

9. The IC package assembly of claim 1, wherein the second electrically conductive package contact comprises an electrical ground contact, and wherein the first electrically conductive package contact electrically comprises an electrical signal contact.

10. The IC package assembly of claim 1, wherein the second electrically conductive package contact comprises an electrical power contact, and wherein the first electrically conductive package contact electrically comprises an electrical signal contact.

11. The IC package assembly of claim 1, wherein the electrically conductive adhesive comprises an epoxy filled with an electrically conductive material.

12. The IC package assembly of claim 1, wherein the first electrically conductive package contact is laterally offset from the second electrically conductive package contact, and wherein the first electrically conductive IC contact is laterally offset from the second electrically conductive IC contact.

13. An integrated circuit (IC) package assembly comprising:
 a package defining a cavity, wherein the package comprises a plurality of package signal contacts, a package power contact, and a package ground contact;
 an IC disposed within the cavity, wherein the IC defines a perimeter including an edge, and wherein the IC comprises a plurality of IC signal contacts, an IC power contact, and an IC ground contact;
 a plurality of wire bonds extending between and electrically connecting respective package signal contacts of the plurality of package signal contacts and respective IC signal contacts of the plurality of IC signal contacts;
 a first electrically conductive adhesive trace extending between and electrically connecting the package power contact and the IC power contact; and
 a second electrically conductive adhesive trace extending between and electrically connecting the package ground contact and the IC ground contact.

14. The IC package assembly of claim 13, wherein at least one IC signal contact of the plurality of IC signal contacts is a first distance from the edge, the IC power contact is a second distance from the edge, and the IC ground contact is a third distance from the edge, wherein the first distance, the second distance, and the third distance are measured in a direction perpendicular to the edge, wherein the first distance is greater than the second distance, and wherein the first distance is greater than the second distance.

15. The IC package assembly of claim 14, wherein the IC power contact, the IC ground contact, and at least one IC signal contact of the plurality of IC signal contacts are located in a line extending perpendicular to the edge of the IC.

16. The IC package assembly of claim 13, further comprising a nonconductive adhesive disposed between the plurality of wire bonds, the first electrically conductive adhesive trace, and the second electrically conductive adhesive trace.

17. A method comprising:
 electrically connecting, using an electrically conductive trace comprising an electrically conductive adhesive, a first electrically conductive package contact of a package and a first electrically conductive integrated circuit (IC) contact of an IC disposed in a cavity defined by the package, wherein the package comprises a ledge, wherein the IC defines a perimeter including an edge, wherein the IC and the package define a channel between the edge of the IC and the ledge, and wherein the electrically conductive adhesive at least partially fills the channel; and
 electrically connecting a second electrically conductive package contact of the package and a second electrically conductive IC contact of the IC using a wire bond, wherein the second electrically conductive package contact is located on the ledge.

18. The method of claim 17, further comprising, prior to electrically connecting the second electrically conductive package contact of the package and the second electrically conductive IC contact, forming a layer of nonconductive adhesive over the electrically conductive trace, wherein the wire bond is disposed over the layer of nonconductive adhesive.

19. The method of claim 18, wherein the electrically conductive trace comprises a first electrically conductive trace, and wherein the layer of nonconductive adhesive comprises a first layer of nonconductive adhesive, the method further comprising:
 forming, using the electrically conductive adhesive, a second electrically conductive trace over the nonconductive adhesive, wherein the second electrically conductive trace electrically connects a third electrically conductive package contact to a third electrically conductive IC contact; and forming a second layer of nonconductive adhesive over the second electrically conductive trace, wherein the wire bond is disposed over the second layer of nonconductive adhesive.

* * * * *